(12) United States Patent
Lee et al.

(10) Patent No.: US 11,646,375 B2
(45) Date of Patent: May 9, 2023

(54) FERROELECTRIC THIN-FILM STRUCTURE AND ELECTRONIC DEVICE INCLUDING THE SAME

(71) Applicant: Samsung Electronics Co., Ltd., Suwon-si (KR)

(72) Inventors: Yunseong Lee, Osan-si (KR); Jinseong Heo, Seoul (KR); Sangwook Kim, Seongnam-si (KR); Taehwan Moon, Suwon-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/112,355

(22) Filed: Dec. 4, 2020

(65) Prior Publication Data
US 2021/0280720 A1 Sep. 9, 2021

(30) Foreign Application Priority Data

Mar. 3, 2020 (KR) .................. 10-2020-0026794

(51) Int. Cl.
H01L 29/78 (2006.01)
H01L 27/1159 (2017.01)
H01L 29/51 (2006.01)
H01L 21/02 (2006.01)

(52) U.S. Cl.
CPC ...... *H01L 29/78391* (2014.09); *H01L 29/516* (2013.01); *H10B 51/30* (2023.02); *H01L 21/02181* (2013.01); *H01L 21/02189* (2013.01)

(58) Field of Classification Search
CPC .......... H01L 27/11585; H01L 27/1159; H01L 29/516; H01L 29/7831; H01L 29/78391
See application file for complete search history.

(56) References Cited

U.S. PATENT DOCUMENTS

| 5,578,846 | A | 11/1996 | Evans, Jr. et al. |
| 6,091,621 | A | 7/2000 | Wang et al. |
| 9,305,921 | B2 * | 4/2016 | Lee ..................... H01L 27/1211 |

(Continued)

FOREIGN PATENT DOCUMENTS

KR 2021-0036714 A 4/2021

OTHER PUBLICATIONS

Li et al., "Threshold Voltage Adjustment of Ferroelectric-Gate Field Effect Transistors by Ion Implantation", Semicond. Sci. Tecnol. 24 (2009) 025012 (4pp).

(Continued)

*Primary Examiner* — Matthew E Warren
(74) *Attorney, Agent, or Firm* — Harness, Dickey & Pierce, P.L.C.

(57) ABSTRACT

Provided is a ferroelectric thin-film structure including a semiconductor substrate, a first ferroelectric layer on the semiconductor substrate, and a second ferroelectric layer on the semiconductor substrate. The second ferroelectric layer is spaced apart from the first ferroelectric layer and has a different dielectric constant from the first ferroelectric layer. The first ferroelectric layer and the second ferroelectric layer may be different from each other in terms of the amount of a dopant contained therein, and may exhibit different threshold voltages when applied to transistors.

26 Claims, 20 Drawing Sheets

(56) References Cited

U.S. PATENT DOCUMENTS

| | | | |
|---|---|---|---|
| 2004/0095181 A1* | 5/2004 | Ohtsuka | G11C 11/22 |
| | | | 327/408 |
| 2007/0049051 A1* | 3/2007 | Ahn | H01L 21/02189 |
| | | | 257/E21.639 |
| 2014/0065809 A1* | 3/2014 | Kim | H01L 21/823462 |
| | | | 438/586 |
| 2015/0214323 A1 | 7/2015 | Dubourdieu et al. | |
| 2016/0284697 A1* | 9/2016 | Yoon | H01L 27/088 |
| 2017/0162250 A1* | 6/2017 | Slesazeck | G11C 11/223 |
| 2018/0240804 A1* | 8/2018 | Yoo | H01L 29/42364 |
| 2019/0355584 A1 | 11/2019 | Yamaguchi | |
| 2020/0058658 A1 | 2/2020 | Heo et al. | |
| 2020/0194591 A1* | 6/2020 | Kim | H01L 21/823412 |
| 2021/0043654 A1* | 2/2021 | Yoo | G11C 11/223 |
| 2021/0098595 A1 | 4/2021 | Lee et al. | |

OTHER PUBLICATIONS

Ando et al., "Ultimate Scaling of High-? Gate Dielectrics: Higher-? or Interfacial Layer Scavenging?", Materials 2012, 5, 478-500; DOI:10.3390/ma5030478.

Extended European Search Report dated Aug. 3, 2021, issued in corresponding European Patent Application No. 21156217.8.

* cited by examiner

FERROELECTRIC THIN-FILM STRUCTURE AND ELECTRONIC DEVICE INCLUDING THE SAME

CROSS-REFERENCE TO RELATED APPLICATION

This application claims the benefit of Korean Patent Application No. 10-2020-0026794, filed on Mar. 3, 2020, in the Korean Intellectual Property Office, the disclosure of which is incorporated herein in its entirety by reference.

BACKGROUND

1. Field

Embodiments set forth herein relate to a ferroelectric thin-film structure and an electronic device including the same.

2. Description of Related Art

As integrated circuit devices are down-scaled, the space occupied therein by electronic devices, e.g., transistors and capacitors, decreases sharply.

In order to achieve ferroelectricity, $HfO_2$ has recently been used, because it is a material capable of overcoming such spatial limitations and exhibiting good operating characteristics. $HfO_2$ exhibits ferroelectricity causing a negative capacitance effect when used together with an additional element such as Zr, and thus, in an electronic device employing $HfO_2$ in a transistor for a logic device, a transistor for a memory device, or the like, power consumption may be dramatically reduced.

When various types of transistors are included in an integrated circuit, it is necessary to set an appropriate threshold voltage for the transistors in the integrated circuit according to the purpose, in order to reduce total power consumption of the integrated circuit.

SUMMARY

Provided is a ferroelectric thin-film structure for easily adjusting a threshold voltage of a plurality of transistors.

Additional aspects will be set forth in part in the description which follows and, in part, will be apparent from the description, or may be learned by practice of the presented embodiments of the disclosure.

According to an embodiment, a ferroelectric thin-film structure includes a semiconductor substrate, a first ferroelectric layer on the semiconductor substrate, and a second ferroelectric layer on the semiconductor substrate. The second ferroelectric layer is spaced apart from the first ferroelectric layer. The second ferroelectric layer has a different dielectric constant than the first ferroelectric layer.

In some embodiments, the first ferroelectric layer and the second ferroelectric layer may include a $HfO_2$-based dielectric material.

In some embodiments, the first ferroelectric layer may include $Hf_xZr_{(1-x)}O$, wherein $0<x<1$, and the second ferroelectric layer may include $Hf_xZr_{(1-x)}O$ doped with a dopant, wherein $0<x<1$.

In some embodiments, the dopant may include one of Si, Hf, Zr, Al, La, Y, Sr and Gd.

In some embodiments, the first ferroelectric layer may include at least one first atomic layer including $HfO_2$, and at least second atomic layer including $ZrO_2$.

In some embodiments, the second ferroelectric layer may include at least one first atomic layer including $HfO_2$, at least one second atomic layer including $ZrO_2$, and at least third atomic layer including $HfO_2$ doped with the dopant or $ZrO_2$ doped with the dopant.

In some embodiments, the third atomic layer may have a thickness of about 10 nm or less.

In some embodiments, an amount of the dopant may be in a range of about 1% and about 10%.

According to another embodiment, an electronic device includes a semiconductor substrate, a first transistor, and a second transistor. The semiconductor substrate includes a first channel region, a first source and a first drain connected to the first channel region, a second channel region, and a second source and a second drain connected to the second channel region. The first transistor includes the first channel region, the first source, the first drain, a first ferroelectric layer on the first channel region, and a first gate electrode on the first ferroelectric layer. The second transistor includes the second channel region, the second source, the second drain, a second ferroelectric layer on the second channel region, and a second gate electrode on the second ferroelectric layer. A dielectric constant of the second ferroelectric layer is different than a dielectric constant of the first ferroelectric layer.

In some embodiments, the first ferroelectric layer and the second ferroelectric layer may include a $HfO_2$-based dielectric material.

In some embodiments, the first ferroelectric layer may include $Hf_xZr_{(1-x)}O$, wherein $0<x<1$, and the second ferroelectric layer may include $Hf_xZr_{(1-x)}O$ doped with a dopant, wherein $0<x<1$.

In some embodiments, the dopant may include one of Si, Al, La, Y, Sr and Gd.

In some embodiments, the first ferroelectric layer may include at least one first atomic layer including $HfO_2$, and at least second atomic layer including $ZrO_2$.

In some embodiments, the second ferroelectric layer may include at least one first atomic layer including $HfO_2$, at least one second atomic layer including $ZrO_2$, and at least third atomic layer including $HfO_2$ doped with the dopant or $ZrO_2$ doped with the dopant.

In some embodiments, the third atomic layer may be located at a position closest to the second channel region among the first atomic layer, the second atomic layer, and the third atomic layer.

In some embodiments, the third atomic layer may have a thickness of about 10 nm or less.

In some embodiments, an amount of the dopant may be in a range of about 1% and about 10%.

In some embodiments, the first channel region and the second channel region may each include at least one of Si, Ge, SiGe, a III-V Group semiconductor, an oxide semiconductor, a nitride semiconductor, an oxynitride semiconductor, a two-dimensional (2D) material, quantum dots, and an organic semiconductor.

In some embodiments, at least one of the first transistor and the second transistor may further include an insulating layer between the first channel region and the first ferroelectric layer or between the second channel region and the second ferroelectric layer.

In some embodiments, at least one of the first transistor and the second transistor may further include an insulating layer between the first ferroelectric layer and the first gate electrode or between the second ferroelectric layer and the second gate electrode; and a metal layer between the insulating layer and the first ferroelectric layer or between the insulating layer and the second ferroelectric layer.

In some embodiments, one of the first transistor and the second transistor may be a transistor for a logic device and an other of the first transistor and the second transistor may be a transistor for a memory device.

According to an embodiment, a ferroelectric thin-film structure includes a semiconductor substrate and a first ferroelectric layer and a second ferroelectric layer spaced apart from each other on the semiconductor substrate. The first ferroelectric layer and the second ferroelectric layer each include a plurality of first atomic layers and a plurality of second atomic layers stacked on each other. A material of the plurality of first atomic layers is different than a material of the plurality of second atomic layers. The second ferroelectric layer further includes one or more third atomic layers having a dopant.

In some embodiments, the plurality of first atomic layers may include $HfO_2$, the plurality of second atomic layers may include $ZrO_2$, and the one or more third atomic layers may include $HfO_2$ or $ZrO_2$.

In some embodiments, the dopant may include one of Si, Hf, Zr, Al, La, Y, Sr, and Gd.

In some embodiments, the one or more third atomic layers may each have a thickness of about 10 nm or less.

According to an embodiment, an electronic device may include the ferroelectric thin-film structure, a first transistor including the first ferroelectric layer, and a second transistor including the second ferroelectric layer. A threshold voltage of the first transistor may be different than a threshold voltage of the second transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
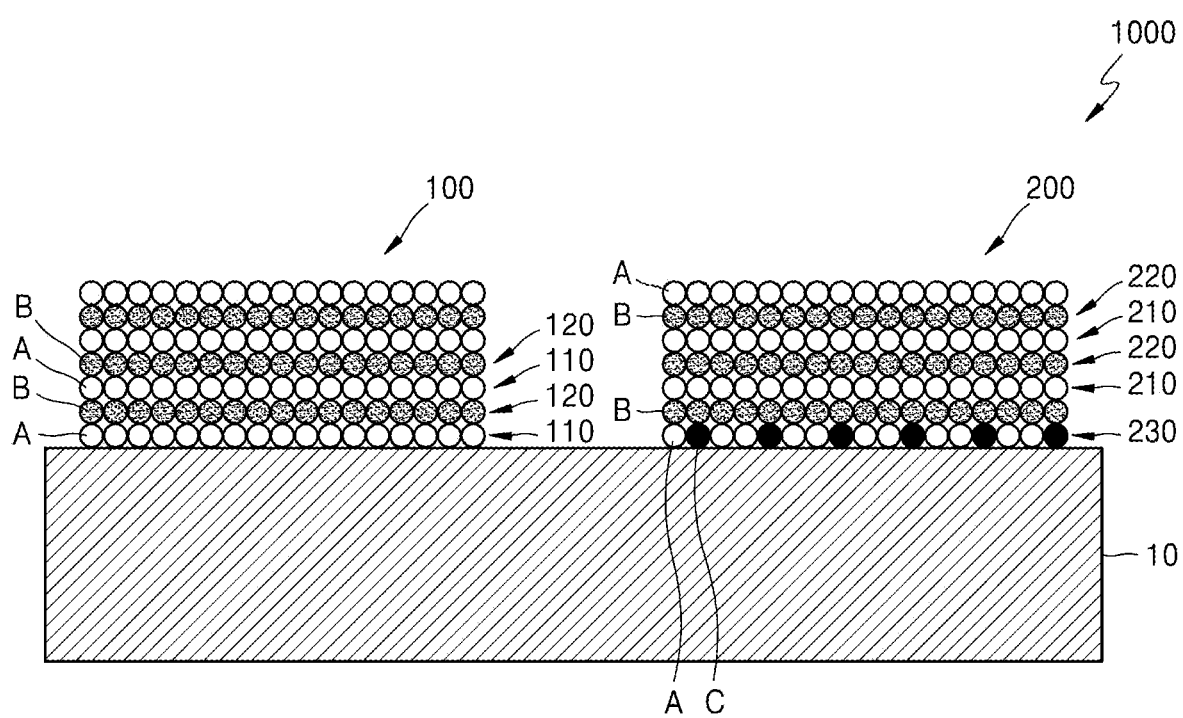
FIG. 1 is a schematic cross-sectional view of an example of a structure of a ferroelectric thin-film structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, embodiments will be described in detail with reference to the accompanying drawings. Embodiments described below are merely examples and various modifications may be made therein. In the drawings, the same reference numerals represent the same elements, and a size of each element may be exaggerated for clarity and convenience of description.

It will be understood that when one element is referred to as being "on" or "above" another element, the element may be on the other element in direct contact with the other element or without contacting the other element.

The terms 'first', 'second,' etc. may be used to describe various elements but are only used herein to distinguish one element from another element. These terms are not intended to limit materials or structures of elements.

As used herein, the singular expressions are intended to include plural forms as well, unless the context clearly dictates otherwise. It will be understood that when an element is referred to as "including" another element, the element may further include other elements unless mentioned otherwise.

Terms such as "unit", "module," and the like, when used herein, represent units for processing at least one function or operation, which may be implemented by hardware, software, or a combination of hardware and software.

The term "the" and demonstratives similar thereto may be understood to include both singular and plural forms.

Unless explicitly stated that operations of a method should be performed in an order described below, the operations may be performed in an appropriate order. In addition, all terms indicating examples (e.g., etc.) are only for the purpose of describing technical ideas in detail, and thus the scope of inventive concepts is not limited by these terms unless limited by the claims.

FIG. 1 is a schematic cross-sectional view of an example of a structure of a ferroelectric thin-film structure according to an embodiment.

The ferroelectric thin-film structure 1000 includes a semiconductor substrate 10, a first ferroelectric layer 100 on the semiconductor substrate 10, and a second ferroelectric layer 200 provided on the semiconductor substrate 10 to be spaced apart from the first ferroelectric layer 100 and having a different dielectric constant from that of the first ferroelectric layer 100.

The first ferroelectric layer 100 and the second ferroelectric layer 200 may be formed of a material exhibiting ferroelectricity.

The first ferroelectric layer 100 and the second ferroelectric layer 200 may include a $HfO_2$-based dielectric material. A dielectric thin-film based on $HfO_2$ may exhibit ferroelectricity depending on a crystalline phase of the thin film. The first ferroelectric layer 100 and the second ferroelectric layer 200 may be formed of a $HfO_2$-based dielectric material to which a dopant is added. Si, Al, Zr, Y, La, Gd, Sr, Hf, or Ce may be used as the dopant. Different dopants may be added to the $HfO_2$-based dielectric material of the first ferroelectric layer 100 and the $HfO_2$-based dielectric material of the second ferroelectric layer 200 so that the first and the second ferroelectric layers 100 and 200 may exhibit ferroelectricity but may have different electrical characteristics, e.g., different dielectric constants.

The first ferroelectric layer 100 and the second ferroelectric layer 200 may include, for example, $Hf_xZr_{(1-x)}O$ (0<x<1). However, embodiments are not limited thereto, and the first ferroelectric layer 100 and the second ferroelectric layer 200 may include at least one of HfO, ZrO, SiO, AlO, CeO, YO, LaO, and a perovskite compound and further include a dopant such as Si, Al, Zr, Y, La, Gd, Sr, Hf, or Ce.

The first ferroelectric layer 100 and the second ferroelectric layer 200 include the $HfO_2$-based material to which the dopant is added to exhibit ferroelectricity, and the ferroelectricity varies according to a specific crystalline phase of this material. This is because a crystal structure may be influenced by materials chemically formed inside a thin film. Therefore, features of a ferroelectric thin-film may be controlled in detail by adjusting a dopant to be added, the amount of the dopant, and the like.

The first ferroelectric layer 100 and the second ferroelectric layer 200 may exhibit different ferroelectric properties, and materials thereof may be set to have different dielectric constants. The first ferroelectric layer 100 and the second ferroelectric layer 200 may exhibit different threshold voltage characteristics, for example, when employed in a transistor.

The first ferroelectric layer 100 may include $Hf_xZr_{(1-x)}O$ (0<x<1), and the second ferroelectric layer 200 may include $Hf_xZr_{(1-x)}O$ doped with a dopant (0<x<1). The dopant doped into the second ferroelectric layer 200 may include Si, Al, Y, La, Gd, Sr, or Ce.

The first ferroelectric layer 100 and the second ferroelectric layer 200 may be formed by an atomic layer deposition (ALD) process, and have a structure in which a plurality of atomic layers are sequentially stacked as illustrated in FIG. 1.

The first ferroelectric layer 100 may include at least one first atomic layer 110 including $HfO_2(A)$ and at least one second atomic layer 120 including $ZrO_2(B)$. The first atomic layer 110 and the second atomic layer 120 may be alternately stacked.

However, the number of times or the order in which the first atomic layer 110 and the second atomic layer 120 are repeatedly stacked in FIG. 1 is only an example. The number of times or the order in which the first atomic layer 110 and the second atomic layer 120 are repeatedly stacked may vary according to a desired content ratio of Hf and Zr in the first ferroelectric layer 100. For example, for the condition that the content ratio of Hf and Zr is 1:4, one first atomic layer 110 and four second atomic layers 120 may be alternately and repeatedly stacked, or any structure that a ratio between the total number of the first atomic layers 110 stacked and the total number of the second atomic layers 120 stacked is 1:4 may be used.

The second ferroelectric layer 200 may include at least one first atomic layer 210 including $HfO_2(A)$, at least one second atomic layer 220 including $ZrO_2(B)$, and at least one third atomic layer 230 including $HfO_2(A)$ doped with a dopant C.

However, the number of times or the order in which the first atomic layer 110, the second atomic layer 120, and the third atomic layer 230 are repeatedly stacked is only an example. The number of times or the order in which the first atomic layer 110, the second atomic layer 120, and the third atomic layer 230 are stacked may vary according to a desired content ratio of Hf and Zr in the second ferroelectric layer 200 and a content ratio of the dopant in the second ferroelectric layer 200.

The content ratios of Hf and Zr in the first ferroelectric layer 100 and the second ferroelectric layer 200 may be similar or almost the same. However, embodiments are not limited thereto and the content ratios of Hf and Zr may be set to be different.

The ratio of Al included in the third atomic layer 230 in FIG. 1 is only an example and thus is not limited thereto. The third atomic layer 230 is illustrated as a lowermost layer of the second ferroelectric layer 200 but is not limited thereto and a position thereof may be changed. When the position of the third atomic layer 230 is changed although the amount of the dopant in the second ferroelectric layer 200 is the same, specific ferroelectric properties of the second ferroelectric layer 200 may change. For example, a dielectric constant may change and a threshold voltage of a transistor employing the second ferroelectric layer 200 may change.

A thickness of the third atomic layer 230 may be appropriately determined in consideration of atomic layer deposition (ALD) process conditions. For example, the thickness of the third atomic layer 230 may be determined by a unit of one cycle of deposition determined by certain process conditions including temperature and a time. The unit of one cycle of deposition may be appropriately determined in terms of fine adjustment of the thickness of the second ferroelectric layer 200. The thickness of the third atomic layer 230 may be about 10 nm or less. The thickness of the third atomic layer 230 may in a range of about 0.05 nm to about 10 nm. The thickness of the third atomic layer 230 may be about 0.1 nm to about 0.9 nm.

The amount of the dopant in the third atomic layer 230 may be set such that the second ferroelectric layer 200 exhibits other meaningful properties compared to the ferroelectricity of the first ferroelectric layer 100. For example, the amount of the dopant may be between 1% and 10%.

The ferroelectric thin-film structure 1000 according to an embodiment includes the ferroelectric layers 100 and 200 on the same semiconductor substrate 10, which are based on similar materials but may exhibit different characteristics. Therefore, it is easy to apply a structure having various threshold voltages in one integrated circuit.

Figure 2:
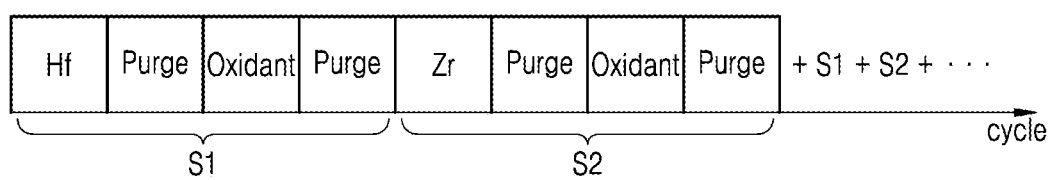
FIG. 2 is a conceptual diagram schematically illustrating a method of manufacturing a first ferroelectric layer included in the ferroelectric thin-film structure of FIG. 1.

FIG. 2 is a conceptual diagram schematically illustrating a method of manufacturing the first ferroelectric layer 100 included in the ferroelectric thin-film structure 1000 of FIG. 1.

In operation S1, an $HfO_2$ atomic layer is formed. Operation S1 may be defined as a unit of one cycle of deposition in which the $HfO_2$ atomic layer is formed. First, a target substrate is placed in a reaction chamber and the reaction chamber is heated to a certain temperature to supply a hafnium (Hf) source for hafnium (Hf) formation. A hafnium (Hf) precursor may be used to deposit hafnium (Hf). The hafnium (Hf) on the target substrate may react with an oxidant to generate a $HfO_2$ atomic layer. A purging process may be carried out before and/or the oxidation reaction after supplying the hafnium (Hf) source. The purging process is a process of discharging by-products, which did not contribute to the oxidation reaction or is generated after the oxidation reaction, out of the reaction chamber. In the purging process, an inert gas such as Ar, He, or Ne or $N_2$ gas may be used.

In operation S2, a $ZrO_2$ atomic layer is formed. After the $HfO_2$ atomic layer is formed, a source for zirconium (Zr) formation is supplied thereon. The reaction chamber is heated to a certain temperature and a source for forming zirconium (Zr) is supplied. A zirconium (Zr) precursor may be used to deposit zirconium (Zr). The Zr deposited on the $HfO_2$ atomic layer reacts with an oxidant to generate $ZrO_2$. That is, a $ZrO_2$ atomic layer is formed on the $HfO_2$ atomic layer. The purging process may be performed before and/or after the oxidation reaction after the Zr source is supplied to discharge by-products out of the reaction chamber after the zirconium (Zr) source is supplied.

A structure in which the $ZrO_2$ atomic layer is stacked on the $HfO_2$ atomic layer may be provided through operations S1 and S2. Next, operations S1 and S2 may be repeated as desired. The number of times operation S1 is repeated and the number of times operation S2 is repeated may be different. Alternatively, immediately after operation S2, operation S1 may not be performed and operation S2 may be performed once more. This may be determined according to a content ratio between Hf and Zr. The first ferroelectric layer 100 of the ferroelectric thin-film structure 100 of FIG. 1 or a modified form thereof may be formed according to a pattern and number of times of repetition of operations S1 and S2.

Figure 3:
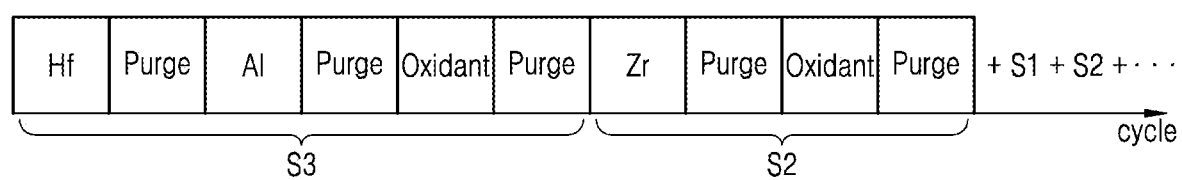
FIG. 3 is a conceptual diagram schematically illustrating a method of manufacturing a second ferroelectric layer included in the ferroelectric thin-film structure of FIG. 1.

FIG. 3 is a conceptual diagram schematically illustrating a method of manufacturing a second ferroelectric layer included in the ferroelectric thin-film structure of FIG. 1.

In operation S3, an $HfO_2$ atomic layer doped with a dopant Al is formed. First, a target substrate is placed in a chamber and heated to a certain temperature to deposit hafnium (Hf) from a hafnium (Hf) precursor onto the target substrate. Next, aluminum (Al) is deposited on the target substrate from an Al precursor. Next, when the resultant structure is reacted with an oxidant, an $HfO_2$ atomic layer doped with aluminum (Al) is formed. For example, a layer such as the third atomic layer 230 of FIG. 1 may be formed. The purging process is a process of discharging reaction by-products from the chamber and may be performed after at least one of: supplying the Hf source; supplying the Al source; and the oxidation reaction.

In operation S2, a $ZrO_2$ atomic layer is formed, and operation S2 is substantially the same as that described above with reference to FIG. 2. By performing operation S2 on the $HfO_2$ atomic layer doped with aluminum (Al), a structure in which the $ZrO_2$ atomic layer is stacked on a layer of $HfO_2$ doped with aluminum (Al) may be formed. Next, operations S1 and S2 may be additionally performed. By performing operations S3, S2, S1 and S2, a structure in which the $HfO_2$ atomic layer and the $ZrO_2$ atomic layer are repeatedly stacked may be provided on the structure in which the layer of $HfO_2$ doped with aluminum (Al) and the $ZrO_2$ atomic layer are stacked. Operations S1 and S2 may be repeated as desired. The number of times operation S1 is repeated and the number of times operation S2 is repeated may be different. Alternatively, immediately after operation S2, operation S1 may not be performed and operation S2 may be performed once more. This may be determined according to a content ratio between Hf and Zr. Operation S3 may be added as desired. Operation S3 may be performed at a different cycle position. The second ferroelectric layer 200 of the ferroelectric thin-film structure 100 of FIG. 1 or a modified form thereof may be formed according to a pattern and a number of times that operations S1 and S2 are repeated.

FIGS. 4 to 6 and 17 are cross-sectional views of modified examples of the second ferroelectric layer of the ferroelectric thin-film structure of FIG. 1.

Figure 4:
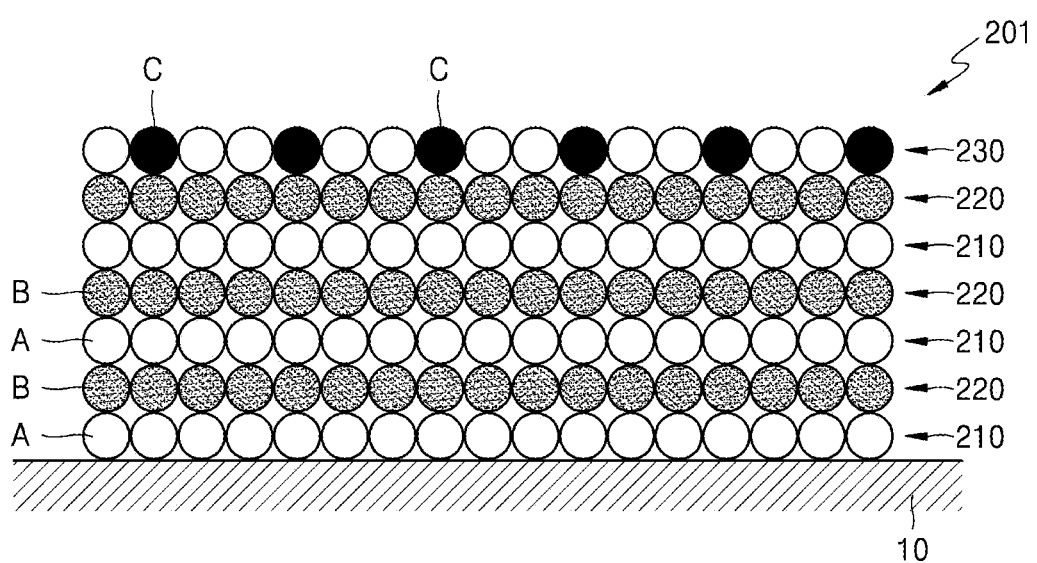
FIGS. 4 to 6 and 17 are cross-sectional views of modified examples of the second ferroelectric layer of the ferroelectric thin-film structure of FIG. 1.

Referring to FIG. 4, a second ferroelectric layer 201 includes a first atomic layer 210 including $HfO_2(A)$, a second atomic layer 220 including $ZrO_2(B)$, and a third atomic layer 230 including $HfO_2(A)$ doped with a dopant C. The third atomic layer 230 may be an uppermost layer of the second ferroelectric layer 201.

Figure 5:
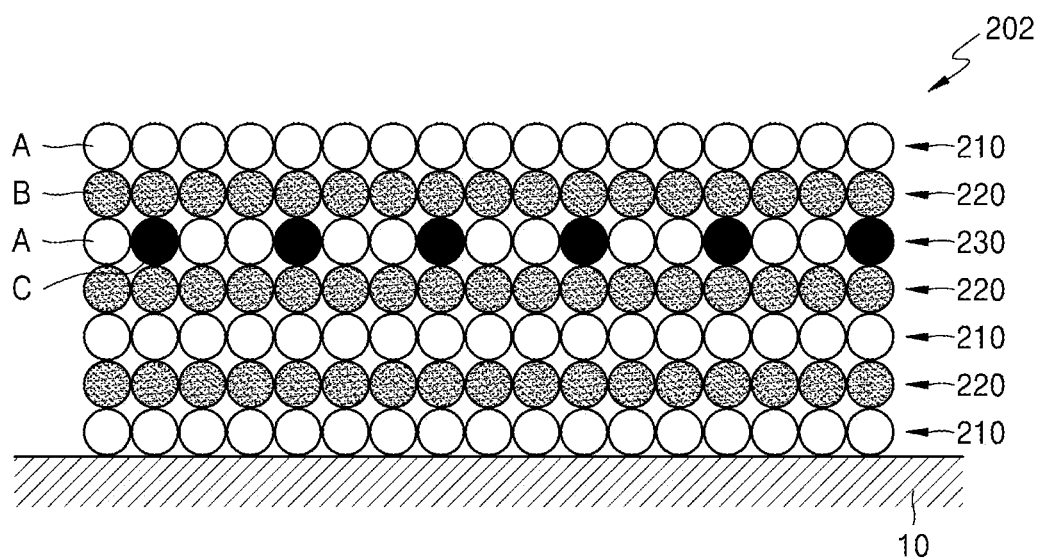

Referring to FIG. 5, a second ferroelectric layer 202 includes a first atomic layer 210 including $HfO_2(A)$, a second atomic layer 220 including $ZrO_2(B)$, and a third atomic layer 230 including $HfO_2(A)$ doped with a dopant C. The third atomic layer 230 may be located in the middle of the second ferroelectric layer 202.

Figure 6:
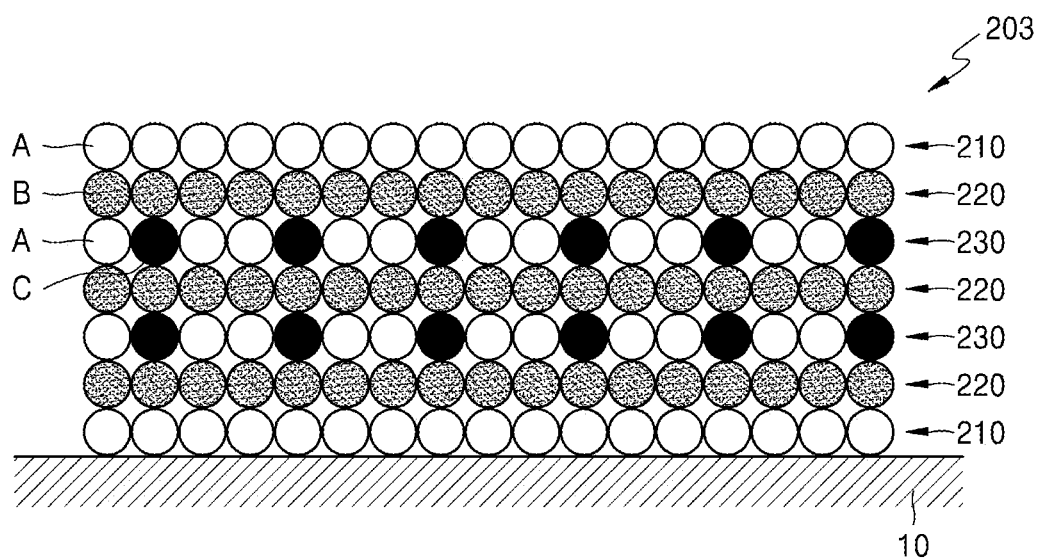
Figure 17:
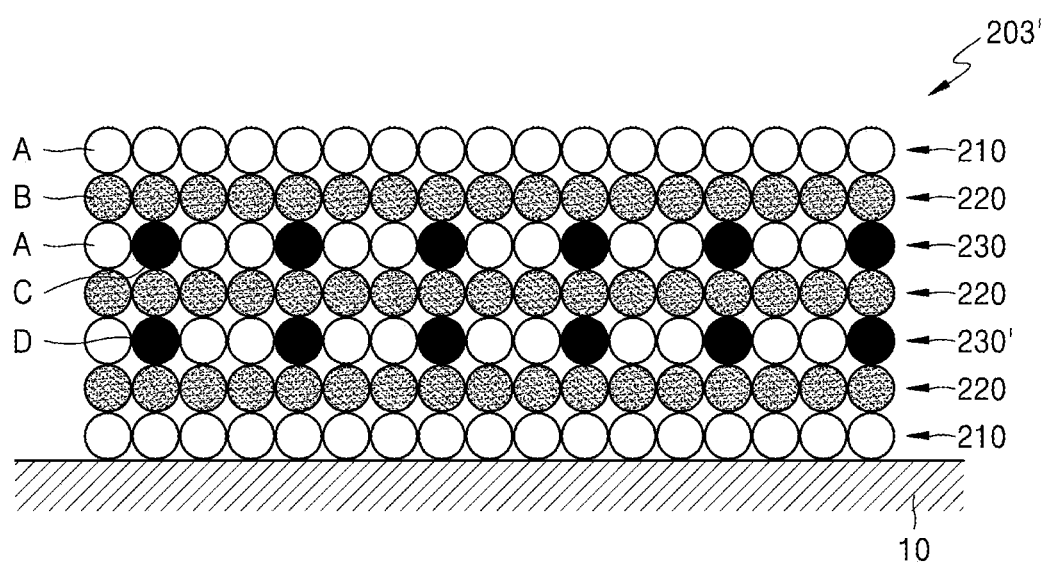

Referring to FIG. 6, a second ferroelectric layer 203 includes a first atomic layer 210 including $HfO_2$ A, a second atomic layer 220 including $ZrO_2$B, and a third atomic layer 230 including $HfO_2(A)$ doped with a dopant C. The third atomic layer 230 may be provided in multiple layers. Although two third atomic layers 230 are illustrated as being located in the middle of the second ferroelectric layer 203, three or more atomic layers 230 may be provided or the positions of the two third atomic layers 230 may be changed. The second ferroelectric layer 203 may be further modified. For example, as depicted in FIG. 17, a second ferroelectric layer 203' may be the same as the second ferroelectric layer 203 in FIG. 6, but the second ferroelectric layer 203' includes one or more atomic layers 230' including $HfO_2(A)$ doped with a dopant D. The dopants C and D may include different dopants among Si, Al, Y, La, Gd, Sr, or Ce.

Figure 7:
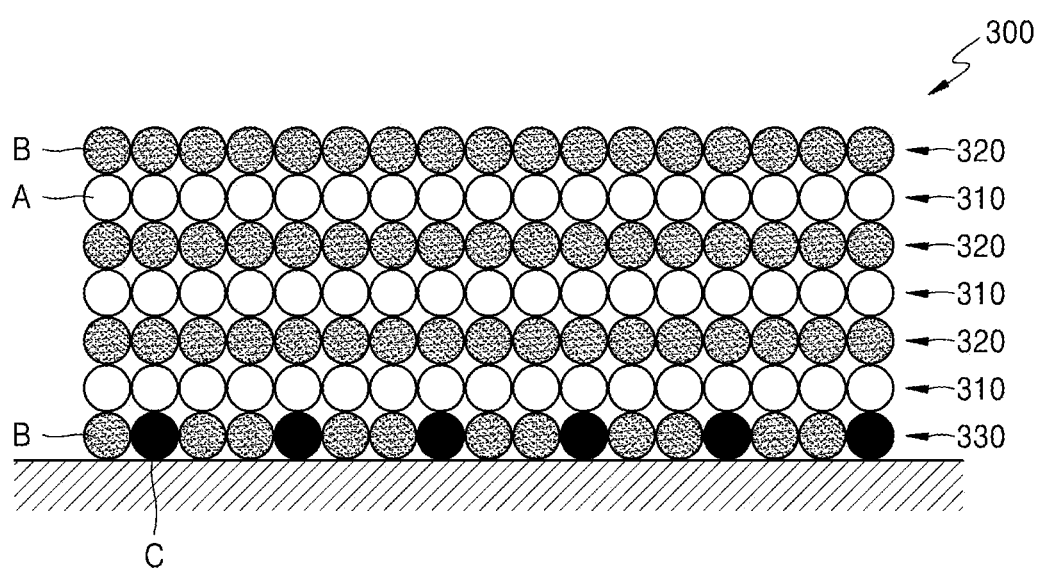
FIG. 7 is a schematic cross-sectional view of a second ferroelectric layer that may be included in the ferroelectric thin-film structure of FIG. 1, according to another embodiment.

FIG. 7 is a schematic cross-sectional view of a second ferroelectric layer that may be included in the ferroelectric thin-film structure of FIG. 1, according to another embodiment.

A second ferroelectric layer 300 may include at least one first atomic layer 310 including $HfO_2$ A, at least one second atomic layer 320 including $ZrO_2$ B, and at least one third atomic layer 330 including $ZrO_2$ B doped with a dopant C.

The number of times or the order in which the first atomic layer 310, the second atomic layer 320, and the third atomic layer 330 are repeatedly stacked is only an example. The number of times or the order in which the first atomic layer 310, the second atomic layer 320, and the third atomic layer 330 are repeatedly stacked may vary according to a desired content ratio of Hf and Zr in the second ferroelectric layer 300 and a content ratio of the dopant in the second ferroelectric layer 300.

The third atomic layer 330 is illustrated as a lowermost layer of the second ferroelectric layer 300 but is not limited thereto and a position thereof may be changed. When the position of the third atomic layer 330 is changed although the amount of the dopant in the second ferroelectric layer 300 is the same, specific ferroelectric properties of the second ferroelectric layer 300 may change.

A thickness of the third atomic layer 330 may be appropriately determined in consideration of ALD process conditions. For example, the thickness of the third atomic layer 330 may be determined by a unit of one cycle of deposition determined by certain process conditions including temperature and a time. The unit of one cycle of deposition may be appropriately determined in terms of fine adjustment of the thickness of the second ferroelectric layer 300. The thickness of the third atomic layer 330 may be about 10 nm or less, for example, may be in a range of 0.05 nm to 10 nm, and may be, for example, about 0.1 nm to about 0.9 nm.

The amount of the dopant in the third atomic layer 330 may be set such that the second ferroelectric layer 300 exhibits other meaningful properties compared to the ferroelectricity of the first ferroelectric layer 100. For example, the amount of the dopant may be between about 1% and about 10%.

Figure 8:
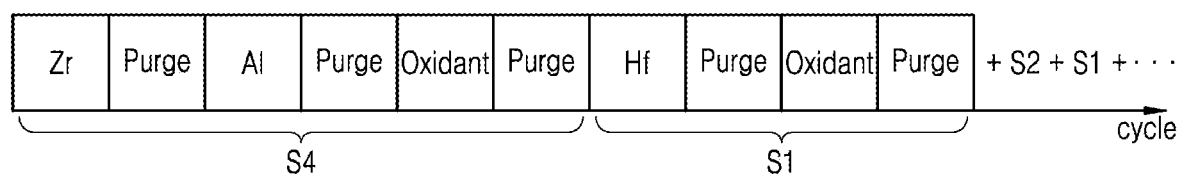
FIG. 8 is a conceptual diagram schematically illustrating a method of manufacturing the second ferroelectric layer of FIG. 7.

FIG. 8 is a conceptual diagram schematically illustrating a method of manufacturing the second ferroelectric layer 300 of FIG. 7.

In operation S4, a $ZrO_2$ atomic layer doped with a dopant Al is formed. First, a target substrate is placed in a chamber and heated to a certain temperature to deposit zirconium (Zr) from a zirconium (Zr) precursor onto the target substrate. Next, aluminum (Al) is deposited on the target substrate from an Al precursor. Next, when the resultant structure is reacted with an oxidant, a $ZrO_2$ atomic layer doped with Al is formed. For example, a layer such as the third atomic layer 300 of FIG. 7 may be formed. The purging process is a process of discharging reaction by-products out of the chamber and may be performed after supplying zirconium (Zr) and/or after supplying aluminum (Al) and/or after the oxidation reaction.

In operation S1, a $HfO_2$ atomic layer is formed, and operation S1 is substantially the same as that described above with reference to FIG. 2. By performing operation S1 on the $ZrO_2$ atomic layer doped with aluminum (Al), a structure in which the $ZrO_2$ atomic layer doped with aluminum (Al) and the $HfO_2$ atomic layer are stacked may be formed. Next, operations S1 and S2 may be performed. By performing operations S4, S1, S2, S1, . . . , a structure in which the $ZrO_2$ atomic layer and the $HfO_2$ atomic layer are repeatedly stacked may be provided on the structure in which the $ZrO_2$ atomic layer doped with aluminum (Al) and the $HfO_2$ atomic layer are stacked. Operations S1 and S2 may be repeated as desired. The number of times operation S1 is repeated and the number of times operation S2 is repeated may be different. Alternatively, immediately after operation S1, operation S2 may not be performed and operation S1 may be performed once more. This may be determined according to a content ratio between Hf and Zr. Operation S4 may be added as desired. Operation S4 may be performed at a different cycle position. The second ferroelectric layer 300 illustrated in FIG. 7 or a modified form thereof may be formed according to a pattern and the number of times of operations S1, S2 and S4 are repeated.

FIGS. 9 to 11 and 18 to 20 are cross-sectional views of modified examples of the second ferroelectric layer 300 of FIG. 7.

Figure 9:
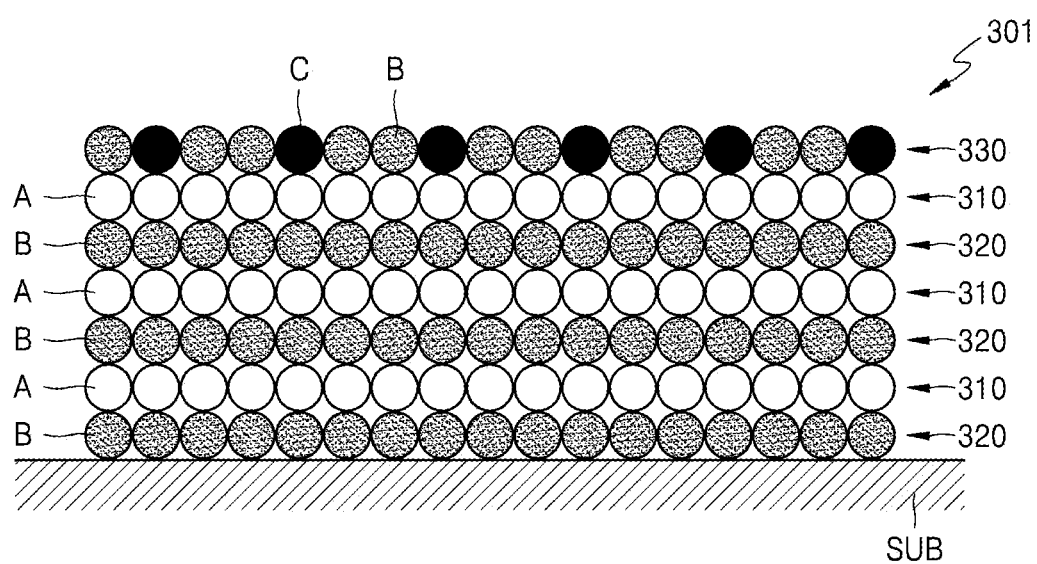
FIGS. 9 to 11 and 18 to 20 are cross-sectional views of modified examples of the second ferroelectric layer of FIG. 7.

Referring to FIG. 9, a second ferroelectric layer 301 includes a first atomic layer 310 including $HfO_2$ A, a second atomic layer 320 including $ZrO_2$ B, and a third atomic layer 330 including $ZrO_2$C doped with a dopant. The third atomic layer 330 may be an uppermost layer of the second ferroelectric layer 301.

Figure 10:
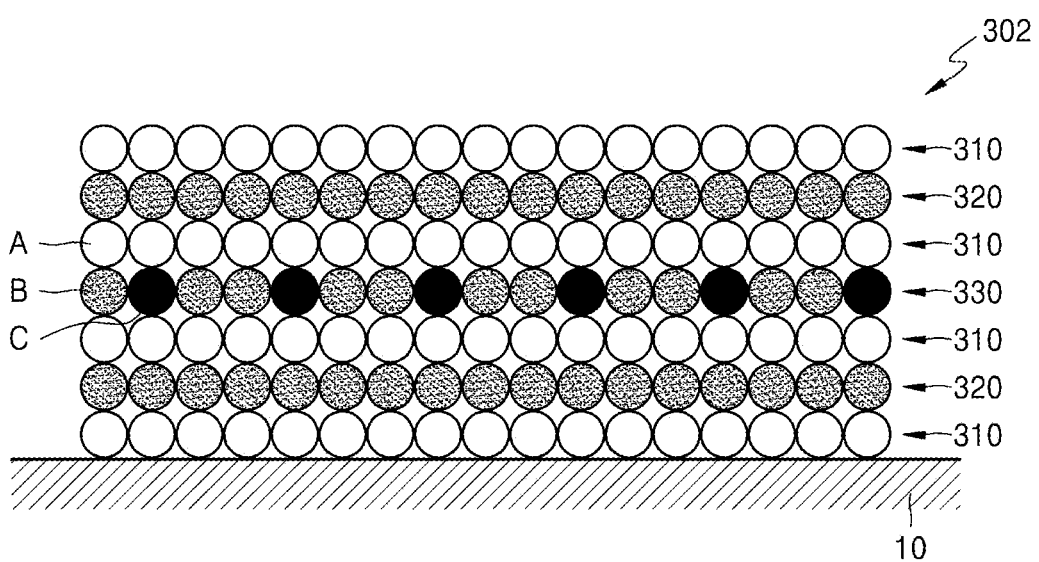

Referring to FIG. 10, a second ferroelectric layer 302 includes a first atomic layer 310 including $HfO_2$ (A), a second atomic layer 320 including $ZrO_2$ (B), and a third atomic layer 330 including $ZrO_2$ (C) doped with a dopant. The third atomic layer 330 may be located in the middle of the second ferroelectric layer 302.

Figure 11:
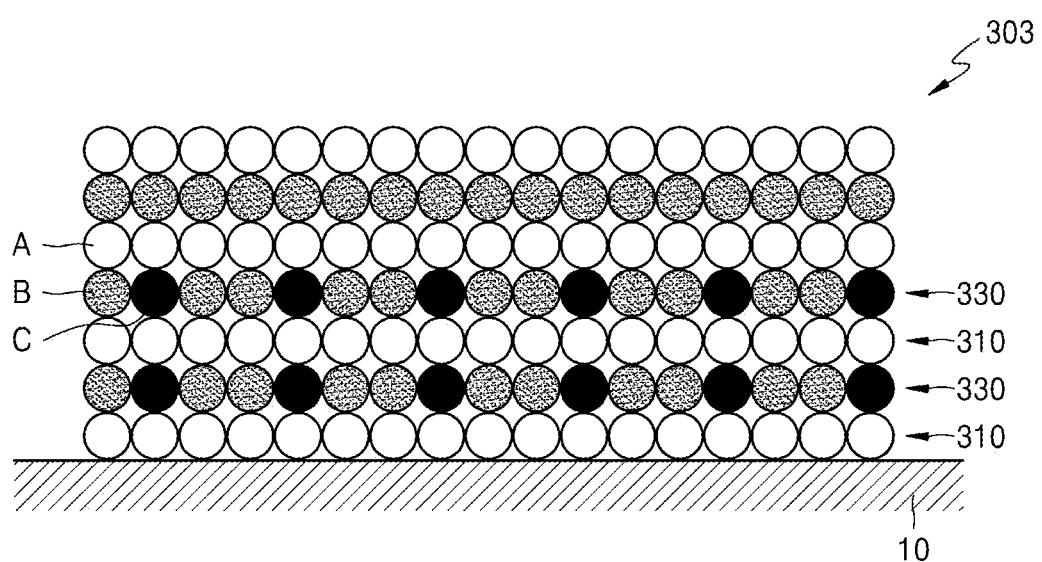
Figure 18:
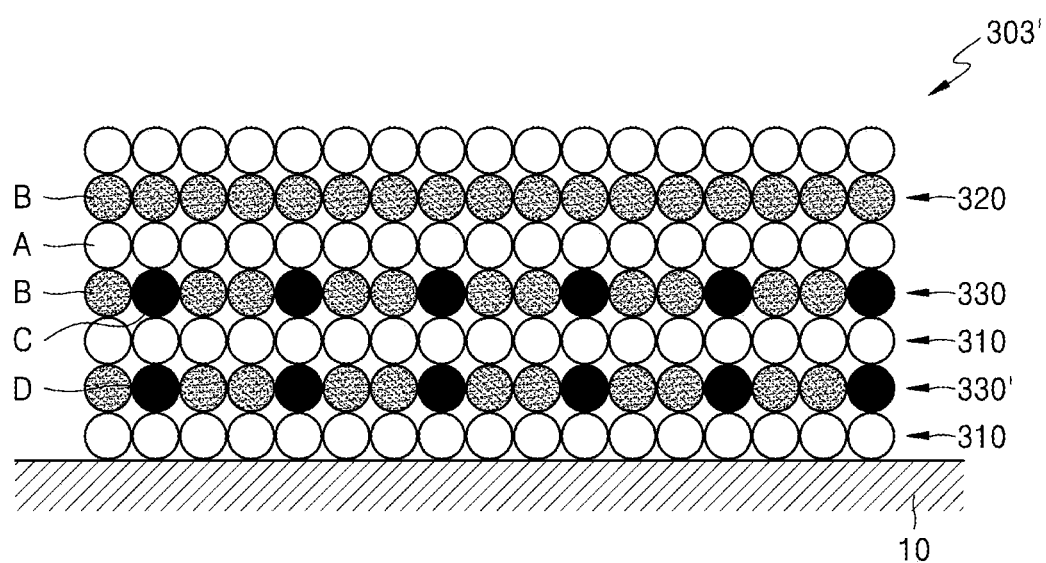
Figure 19:
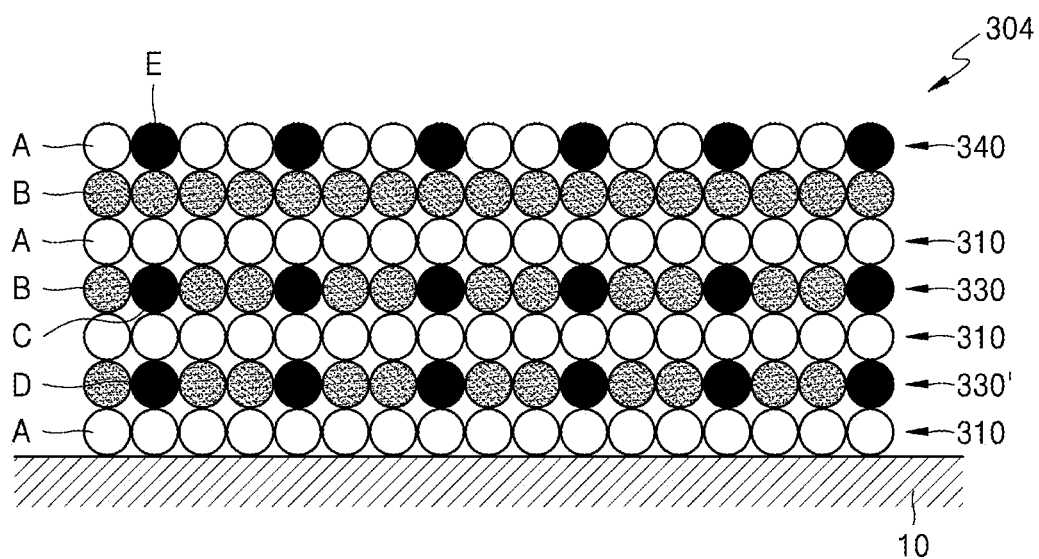
Figure 20:
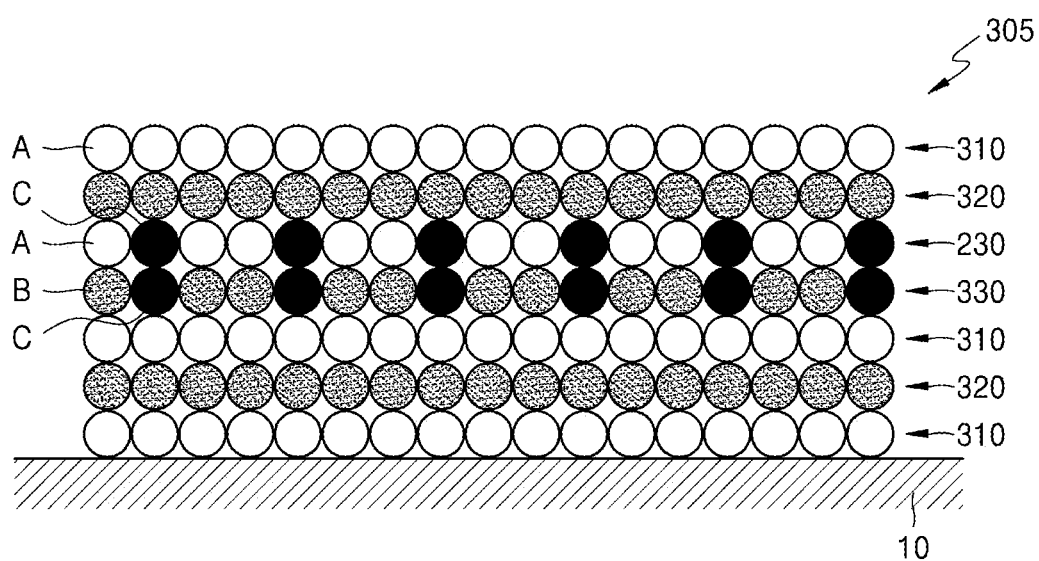

Referring to FIG. 11, a second ferroelectric layer 303 includes a first atomic layer 310 including $HfO_2$ (A), a second atomic layer 320 including $ZrO_2$ (B), and a third atomic layer 330 including $ZrO_2$ (B) doped with a dopant C. The third atomic layer 330 may be provided in multiple layers. Although two third atomic layers 330 are illustrated as being located in the middle of the second ferroelectric layer 303, three or more atomic layers 330 may be provided or the two third atomic layers 330 may be provided at different positions. The second ferroelectric layer 303 may be modified in various ways. For example, as depicted in FIG. 18, a second ferroelectric layer 303' may be the same as the ferroelectric layer 303 in FIG. 11, but may include one or more atomic layers 330' including $ZrO_2$ (B) doped with a dopant D that is different than the dopant C. As depicted in FIG. 19, a second ferroelectric layer 304 may include one or more atomic layers 340 including $HfO_2$ (A) doped with a dopant E. The dopants C, D, and E may include different dopants among Si, Al, Y, La, Gd, Sr, or Ce. Also, as depicted in FIG. 20, a second ferroelectric layer 305 may be the same as the second ferroelectric layer 303 in FIG. 11, except the second ferroelectric layer 305 may include an atomic layer 230 including $HfO_2$ (A) doped with the dopant C.

Figure 12:
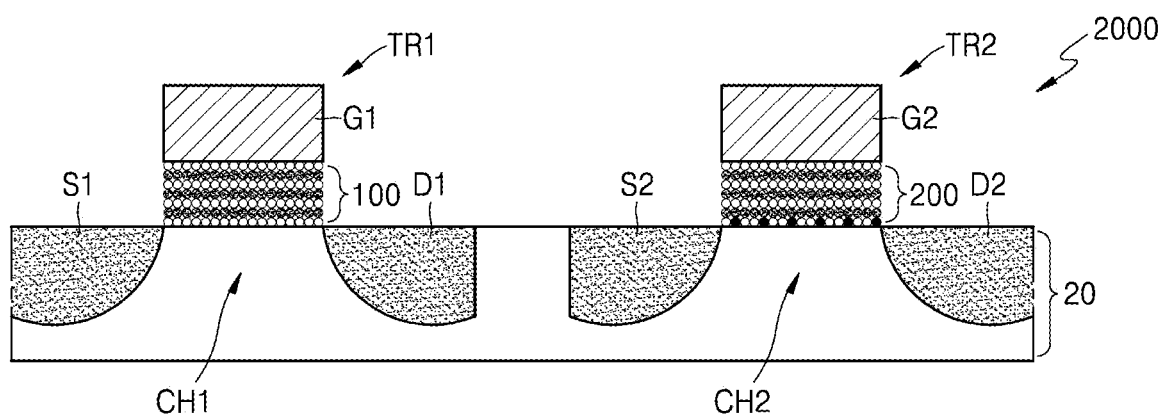
FIG. 12 is a schematic cross-sectional view of an electronic device according to an embodiment.

FIG. 12 is a schematic cross-sectional view of an electronic device according to an embodiment.

An electronic device 2000 includes a semiconductor substrate 20, a first ferroelectric layer 100 on the semiconductor substrate 20, a first gate electrode G1 on the first ferroelectric layer 100, a second ferroelectric layer 200 provided on the semiconductor substrate 20 to be spaced apart from the first ferroelectric layer 100, and a second gate electrode G2 on the second ferroelectric layer 200.

The semiconductor substrate 20 includes a first channel region CH1, a first source S1 and a first drain D1 connected to the first channel region CH1, a second channel region CH2, and a second source S2 and a second drain D2 connected to the second channel region CH2. The first ferroelectric layer 100 is provided on the first channel region CH1, and the second ferroelectric layer 200 is provide on the second channel region CH2.

The semiconductor substrate 20 may be a silicon (Si) substrate. However, embodiments are not limited thereto, and the semiconductor substrate 20 may include at least one of other materials, e.g., Ge, SiGe, a Group III-V semiconductor, an oxide semiconductor, a nitride semiconductor, an oxynitride semiconductor, a two-dimensional (2D) material, quantum dots, and an organic semiconductor.

The first channel region CH1 and the second channel region CH2 may each include at least one of Si, Ge, SiGe, a Group III-V semiconductor, an oxide semiconductor, a nitride semiconductor, an oxynitride semiconductor, a 2D material, quantum dots, and an organic semiconductor.

The first source S1 and the first drain D1 may be electrically connected to opposite sides of the first channel region CH1 which are spaced apart from each other, and the second source S2 and the second drain D2 may be electrically connected to both sides of the second channel region CH2 which are spaced apart from each other. These regions may be formed by implanting impurities into a plurality of different regions of the semiconductor substrate 20, and may be high-concentration semiconductor regions.

The first channel region CH1, the first source S1, the first drain D1, the first ferroelectric layer 100, and the first gate electrode G1 form a first transistor TR1. The second channel region CH2, the second source S2, the second drain D2, the second ferroelectric layer 200, and the second gate electrode G2 form a second transistor TR1.

One of the first transistor TR1 and the second transistor TR2 may be a transistor for a logic device, and the other may be a transistor for a memory device. The first transistor TR1 and the second transistor TR2 may have different threshold voltages.

To this end, the first ferroelectric layer 100 of the first transistor TR1 and the second ferroelectric layer 200 of the second transistor TR2 include, for example, materials or compositions having different dielectric constants, so that the first and second ferroelectric layers 100 and 200 may have ferroelectricity but have different electrical properties.

As described above, the first ferroelectric layer 100 and the second ferroelectric layer 200 include a $HfO_2$-based dielectric material, and may further include different dopants. For example, the first ferroelectric layer 100 may include $Hf_xZr_{(1-x)}O$ (0<x<1), and the second ferroelectric layer 200 may include $Hf_xZr_{(1-x)}O$ doped with a dopant (0<x<1).

In the second transistor TR2, the second ferroelectric layer 200 is illustrated as having the structure illustrated in FIG. 1 but is not limited thereto and may have a structure illustrated in FIGS. 4-7, 9-11, and 17-20, or a modified example thereof.

Ferroelectricity may cause a negative capacitance effect and thus power consumption of the electronic device employing a ferroelectric material may be drastically reduced.

The power consumption of the electronic device 2000 is related to a threshold voltage of each transistor included in the electronic device 2000. In theory, when a gate voltage and drain current characteristics of an existing metal oxide semiconductor field-effect transistor (MOSFET) are measured, it is difficult for subthreshold swing (SS) to be reduced to less than about 60 mV/dec in a subthreshold region lower than a threshold voltage. Accordingly, as a device becomes smaller in size, an operating voltage cannot be reduced to a certain value or less, thus having an effect on an increase in power consumption of an integrated circuit. However, it has been known that when a ferroelectric material is employed in a transistor as in an embodiment, a threshold voltage may be lowered by domain switching that occurs when an electric field is applied to the ferroelectric material. This effect is referred to as the negative capacitance effect.

In the case of an integrated device with a plurality of transistors, such as the electronic device 2000 according to the embodiment, it is necessary for each of the transistors to have an appropriate threshold voltage so as to reduce total power consumption. For example, a transistor of SRAM may have a high threshold voltage, and a transistor of a logic device may have a low threshold voltage.

The electronic device 2000 according to the embodiment includes the first transistor TR1 and the second transistor TR2 having different threshold voltages, and one of the first and second transistors TR1 and TR2 may be used for a memory device and the other may be used for a logic device, thereby effectively reducing total power consumption of the electronic device 2000.

In the electronic device 2000 according to the embodiment, the first ferroelectric layer 100 and the second ferroelectric layer 200 on the same semiconductor substrate 20 are formed of dielectric materials based on the same material to achieve ferroelectricity but are different in terms of the type or amount of dopant, thereby easily obtaining two transistors having different threshold voltages.

In general, a method of adjusting a doping concentration of a silicon channel is used to provide a plurality of transistors having different low threshold voltages in one chip. For example, in this method, first, an entire silicon substrate is doped to appropriate doping concentration to achieve a desired threshold voltage, and then, to achieve a different threshold voltage, a corresponding channel region is additionally doped. In this method, a threshold voltage of a transistor is determined by the additional doping of the silicon substrate, and thus, as a device becomes smaller in size, there are difficulties such as the need for a more precise doping technique to control the distribution of a doping concentration.

In an embodiment, transistors are formed based on the same semiconductor substrate 20, and doping of the first channel region CH1 and the second channel region CH2 do not need to be individually and finely controlled. That is, the first channel region CH1 and the second channel region CH2 may have the same physical properties and the same doping concentration, and the first transistor TR1 and the second transistor employing the first and second channels regions CH1 and CH2 but having different threshold voltages may be obtained.

Figure 13:
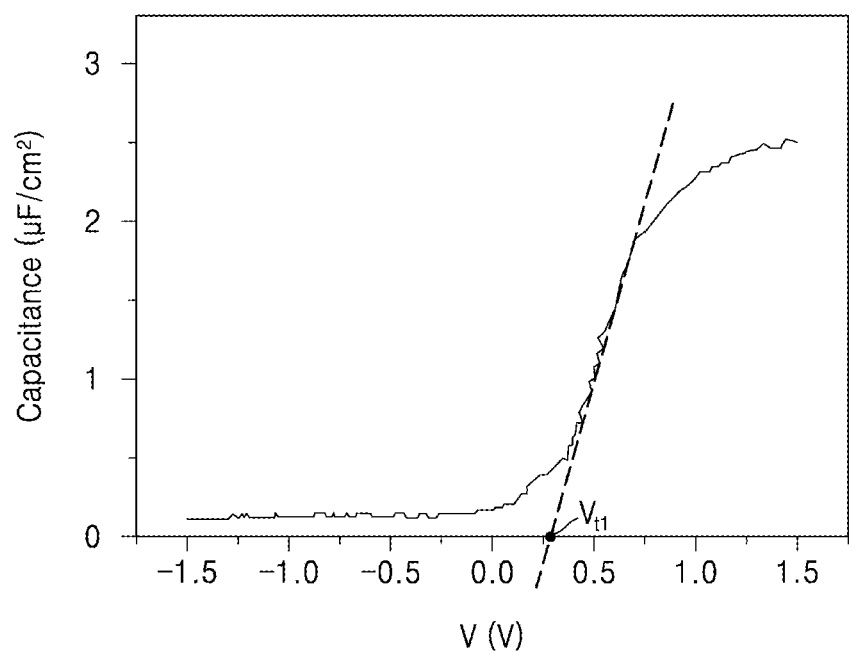
FIGS. 13 and 14 are graphs conceptually illustrating that two transistors of FIG. 12 have different threshold voltages.
Figure 14:
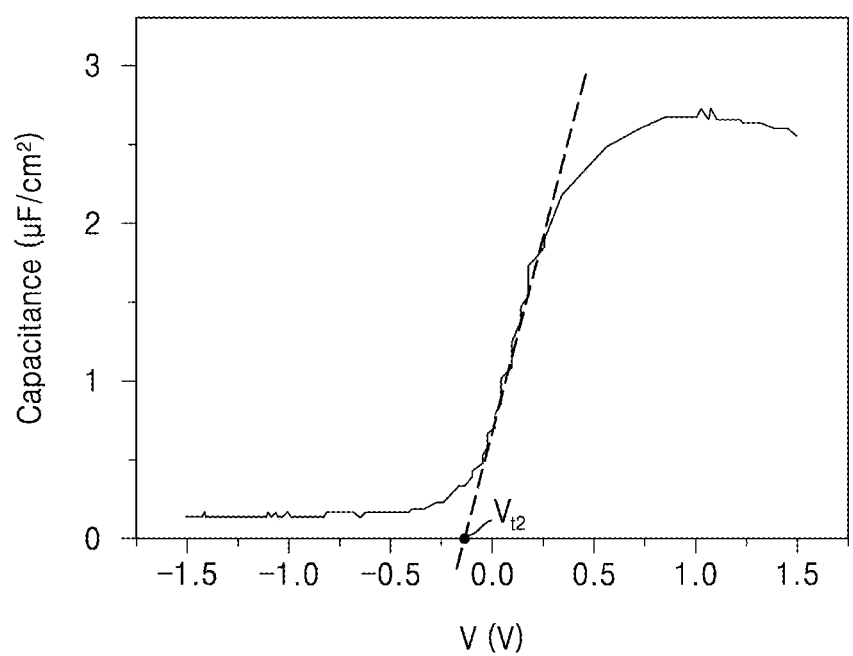

FIGS. 13 and 14 are graphs conceptually showing that the two transistors of FIG. 12 have different threshold voltages.

FIG. 13 illustrates a threshold voltage $V_{t1}$ obtained by the first ferroelectric layer 100. FIG. 14 illustrates a threshold voltage $V_{t2}$ obtained by the second ferroelectric layer 200. As shown in the graphs, the same ferroelectric material based on HfZrO has different threshold voltages depending on whether aluminum (Al) is doped or not.

In addition, by adjusting the type or amount of dopant, a doping position, and the like, a range of change of a threshold voltage may be additionally adjusted and a desired threshold voltage suitable for a device to which a transistor is to be applied may be obtained.

Figure 15:
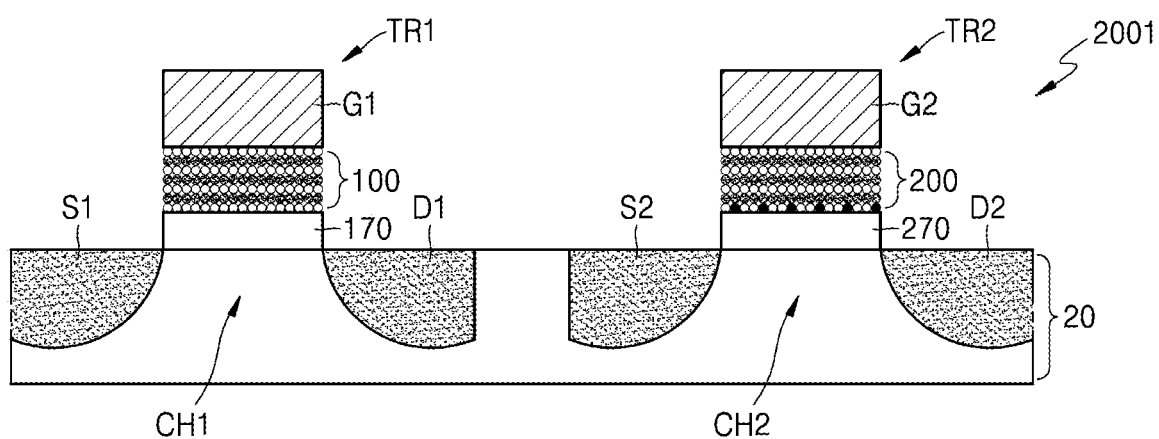
FIGS. 15 and 16 are schematic cross-sectional views of electronic devices according to other embodiments.

FIG. 15 is a schematic cross-sectional view of an electronic device according to another embodiment.

An electronic device 2001 of FIG. 15 is different from the electronic device 2000 of FIG. 12 in that a first transistor TR1 further includes a first insulating layer 170 between a first ferroelectric layer 100 and a first channel region CH1 and a second transistor TR2 further includes a second insulating layer 270 between a second ferroelectric layer 200 and a second channel region CH2.

The first insulating layer 170 and the second insulating layer 270 may be layers for suppressing or preventing electrical leakage. A Si oxide (SiO), an Al oxide (AlO), a Hf oxide (HfO), a Zr oxide (ZrO), or a 2D insulator may be used as the first insulating layer 170 and the second insulating layer 270. A material such as hexagonal boron nitride (h-BN) may be used as the 2D insulator. However, materials of the first insulating layer 170 and the second insulating layer 270 are not limited thereto.

Although both the first and second transistors TR1 and TR2 are illustrated as further including the insulating layers 170 and 270, embodiments are not limited thereto and only one thereof may further include an insulating layer. In other words, the first insulating layer 170 or the second insulating layer 270 may be omitted.

Figure 16:
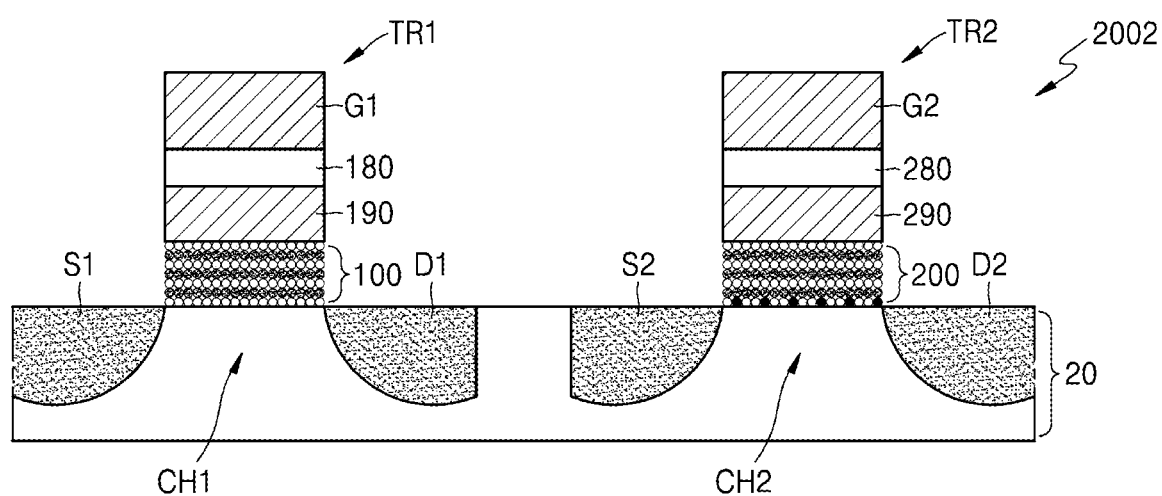

FIG. 16 is a schematic cross-sectional view of an electronic device according to another embodiment.

Referring to FIG. 16, a first transistor TR1 and a second transistor TR2 included in an electronic device 2002 are different from those of the electronic device 2000 of FIG. 12 in terms of a detailed structure.

The first transistor TR1 includes a first ferroelectric layer 100, a first conductive layer 190, a first insulating layer 180, and a first gate electrode G1 which are sequentially disposed on a first channel region CH1.

The second transistor TR2 includes a second ferroelectric layer 200, a second conductive layer 290, a second insulating layer 280, and a second gate electrode G2 which are sequentially disposed on a second channel region CH2.

A Si oxide (SiO), an Al oxide (AlO), a Hf oxide (HfO), a Zr oxide (ZrO), or a 2D insulator may be used as the first insulating layer 180 and the second insulating layer 280. A material such as hexagonal boron nitride (h-BN) may be used as the 2D insulator. However, materials of the first insulating layer 180 and the second insulating layer 280 are not limited thereto.

The first conductive layer 190 and the second conductive layer 290 may include a metal including TiN, W, Mo, Ni, or the like, a conductive oxide including $RuO_2$, $SrRuO_3$, ITO, or the like, or a 2D material including graphene. The first conductive layer 400 may also include metal nitride or metal oxynitride. However, materials of the first conductive layer 190 and the second conductive layer 290 are not limited thereto.

In the drawing, both of the first and second transistors TR1 and TR2 are illustrated as additionally including an insulating layer and a metal layer but are not limited thereto. For example, the first transistor TR1 or the second transistor TR2 may be changed to the first transistor TR1 or the second transistor TR2 illustrated in FIG. 15 or 12.

The above-described electronic devices 2000, 2001, and 2002 may form an integrated device and part of an integrated circuit. The electronic devices 2000, 2001, and 2002 may each include other transistors, capacitors, and the like, in addition to the illustrated first transistor TR1 and second transistor TR2, and employ a ferroelectric material, the threshold voltage of which is easily adjustable, and the sizes and power consumption thereof may be reduced and the performance thereof may be increased.

The above-described ferroelectric thin-film structures may exhibit ferroelectric characteristics having different dielectric constants by adjusting a dopant added to a $HfO_2$-based dielectric material.

Such a ferroelectric thin-film structure is applicable to an electronic device utilizing a plurality of transistors having different threshold voltages.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A ferroelectric thin-film structure comprising:
   a semiconductor substrate;
   a first ferroelectric layer on a first transistor region of the semiconductor substrate; and
   a second ferroelectric layer on a second transistor region of the semiconductor substrate, the second ferroelectric layer spaced apart from the first ferroelectric layer, a dielectric constant of the second ferroelectric layer being different than a dielectric constant of the first ferroelectric layer, wherein
   the first transistor region of the semiconductor substrate and the second transistor region of the semiconductor substrate are spaced apart from each other.

2. The ferroelectric thin-film structure of claim 1, wherein the first ferroelectric layer and the second ferroelectric layer comprise a $HfO_2$-based dielectric material.

3. The ferroelectric thin-film structure of claim 2, wherein the first ferroelectric layer comprises $Hf_xZr_{(1-x)}O$, wherein $0<x<1$, and
   the second ferroelectric layer comprises $Hf_xZr_{(1-x)}O$ doped with a dopant, wherein $0<x<1$.

4. The ferroelectric thin-film structure of claim 3, wherein the dopant comprises one of Si, Hf, Zr, Al, La, Y, Sr, and Gd.

5. The ferroelectric thin-film structure of claim 3, wherein the first ferroelectric layer comprises:
   at least one first atomic layer including $HfO_2$; and
   at least one second atomic layer including $ZrO_2$.

6. The ferroelectric thin-film structure of claim 3, wherein the second ferroelectric layer comprises:
   at least one first atomic layer including $HfO_2$;
   at least one second atomic layer including $ZrO_2$; and
   at least one third atomic layer including $HfO_2$ doped with the dopant or $ZrO_2$ doped with the dopant.

7. The ferroelectric thin-film structure of claim 6, wherein the at least one third atomic layer has a thickness of about 10 nm or less.

8. The ferroelectric thin-film structure of claim 3, wherein an amount of the dopant is in a range of about 1% to about 10%.

9. A The ferroelectric thin-film structure of claim 1, wherein
   the first ferroelectric layer and the second ferroelectric layer each include a plurality of first atomic layers and a plurality of second atomic layers stacked on each other,
   a material of the plurality of first atomic layers is different than a material of the plurality of second atomic layers, and
   the second ferroelectric layer further includes one or more third atomic layers having a dopant.

10. The ferroelectric thin-film structure of claim 9, wherein
    the plurality of first atomic layers include $HfO_2$,
    the plurality of second atomic layers include $ZrO_2$, and
    the one or more third atomic layers include $HfO_2$ or $ZrO_2$.

11. The ferroelectric thin-film structure of claim 9, wherein
    the dopant includes one of Si, Hf, Zr, Al, La, Y, Sr, and Gd.

12. The ferroelectric thin-film structure of claim 2, wherein
    the one or more third atomic layers each have a thickness of about 10 nm or less.

13. An electronic device, comprising:
the ferroelectric thin-film structure of claim 9;
a first transistor including the first ferroelectric layer; and
a second transistor including the second ferroelectric layer, wherein
a threshold voltage of the first transistor is different than a threshold voltage of the second transistor.

14. An electronic device comprising:
a semiconductor substrate including a first channel region, a first source and a first drain each connected to the first channel region, a second channel region, and a second source and a second drain each connected to the second channel region;
a first transistor including the first channel region, the first source, the first drain, a first ferroelectric layer on the first channel region, and a first gate electrode on the first ferroelectric layer; and
a second transistor including the second channel region, the second source, the second drain, a second ferroelectric layer on the second channel region, and a second gate electrode on the second ferroelectric layer, a dielectric constant of the second ferroelectric layer being different than a dielectric constant of the first ferroelectric layer.

15. The electronic device of claim 14, wherein the first ferroelectric layer and the second ferroelectric layer comprise a $HfO_2$-based dielectric material.

16. The electronic device of claim 15, wherein
the first ferroelectric layer comprises $Hf_xZr_{(1-x)}O$, wherein $0<x<1$, and
the second ferroelectric layer comprises $Hf_xZr_{(1-x)}O$ doped with a dopant, wherein $0<x<1$.

17. The electronic device of claim 16, wherein the dopant comprises one of Si, Al, La, Y, Sr, and Gd.

18. The electronic device of claim 16, wherein the first ferroelectric layer comprises:
at least one first atomic layer including $HfO_2$; and
at least one second atomic layer including $ZrO_2$.

19. The electronic device of claim 16, wherein the second ferroelectric layer comprises:
at least one first atomic layer including $HfO_2$;
at least one second atomic layer including $ZrO_2$; and
at least one third atomic layer including $HfO_2$ doped with the dopant or $ZrO_2$ doped with the dopant.

20. The electronic device of claim 19, wherein the at least one third atomic layer is located at a position closest to the second channel region among the at least one first atomic layer, the at least one second atomic layer, and the at least one third atomic layer.

21. The electronic device of claim 19, wherein the at least one third atomic layer has a thickness of about 10 nm or less.

22. The electronic device of claim 16, wherein an amount of the dopant is in a range of about 1% to about 10%.

23. The electronic device of claim 14, wherein the first channel region and the second channel region each comprise at least one of Si, Ge, SiGe, a Group III-V semiconductor, an oxide semiconductor, a nitride semiconductor, an oxynitride semiconductor, a two-dimensional (2D) material, quantum dots, and an organic semiconductor.

24. The electronic device of claim 14, wherein at least one of the first transistor and the second transistor further comprises an insulating layer between the first channel region and the first ferroelectric layer or between the second channel region and the second ferroelectric layer.

25. The electronic device of claim 14, wherein at least one of the first transistor and the second transistor further comprises:
an insulating layer between the first ferroelectric layer and the first gate electrode or between the second ferroelectric layer and the second gate electrode; and
a metal layer between the insulating layer and the first ferroelectric layer or between the insulating layer and the second ferroelectric layer.

26. The electronic device of claim 14, wherein one of the first transistor and the second transistor is a transistor for a logic device and an other of the first transistor and the second transistor is a transistor for a memory device.

* * * * *